United States Patent [19]

Kiesel et al.

[11] 4,181,389

[45] Jan. 1, 1980

[54] TAP CHANGING ELECTRICAL CONNECTOR FOR STATIC TRIP CIRCUIT BREAKERS

[75] Inventors: George W. Kiesel, Burlington; Henry G. Willard, Wethersfield, both of Conn.

[73] Assignee: General Electric Company, New York, N.Y.

[21] Appl. No.: 942,019

[22] Filed: Sep. 13, 1978

[51] Int. Cl.[2] .................... H01R 29/00; H02H 3/28; H05K 1/07

[52] U.S. Cl. .................... 339/32 M; 361/115

[58] Field of Search .................... 339/17 L, 31 R, 31 M, 339/32 R, 32 M, 33; 361/115, 412

[56] References Cited

U.S. PATENT DOCUMENTS

| | | | |
|---|---|---|---|
| 3,231,767 | 1/1966 | Powell | 339/32 M |
| 3,838,315 | 9/1974 | Wilbourn | 361/412 |
| 4,077,055 | 2/1978 | Wilson et al. | 361/115 |
| 4,087,151 | 5/1978 | Robert et al. | 339/176 MP |
| 4,122,313 | 10/1978 | DeLuca | 339/32 R |

*Primary Examiner*—Neil Abrams

*Attorney, Agent, or Firm*—Robert A. Cahill; Walter C. Bernkopf; Philip L. Schlamp

[57] ABSTRACT

A receptacle having a pocket accommodating the insertion of an insulative printed circuit card is equipped with one set of contacts disposed to one side of the pocket and individually electrically connected to a breaker static trip unit. Two additional sets of contacts, disposed to the other side of the pocket, are respectively connected to different secondary winding taps of each of a plurality of phase current transformers. Plural pairs of electrically interconnected conductive strips are printed on opposite sides of the card in positions to connect the contacts of the one set individually to the contacts of either one of the two additional sets, depending upon the orientation of the card when inserted in the pocket.

10 Claims, 10 Drawing Figures

FIG. 2
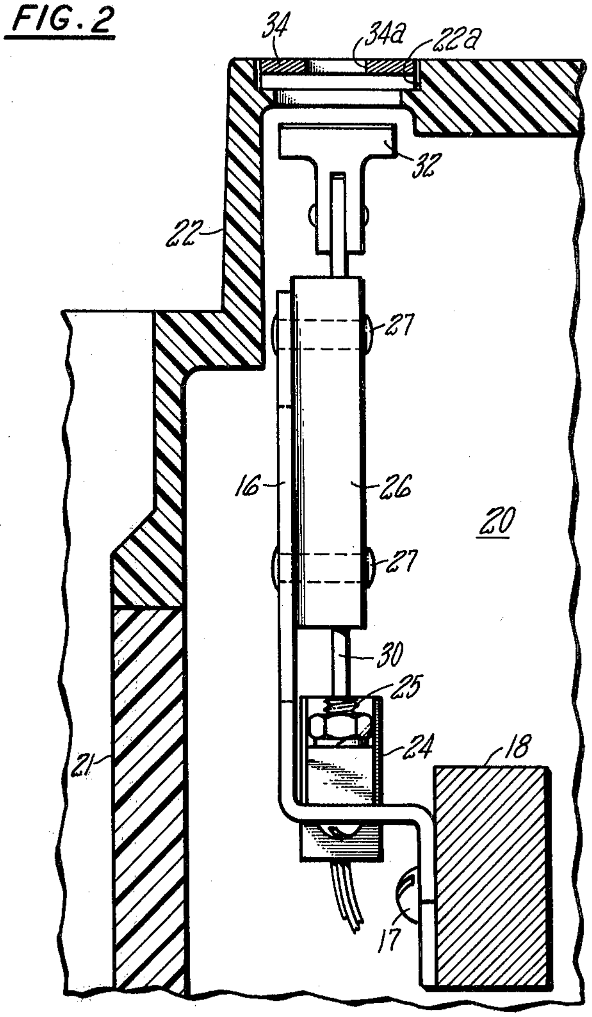
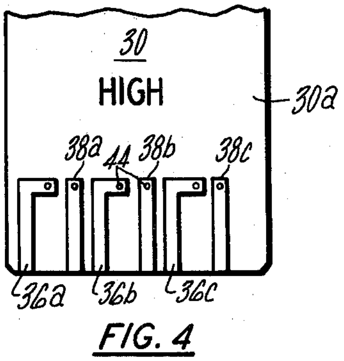
FIG. 4
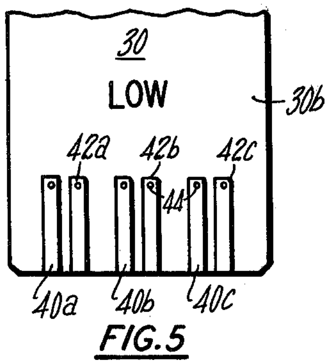
FIG. 5

TAP CHANGING ELECTRICAL CONNECTOR FOR STATIC TRIP CIRCUIT BREAKERS

BACKGROUND OF THE INVENTION

The present invention relates to electrical connectors and particularly to an electrical connector selectively operable to connect any one of plural sets of input leads to a common set of output leads.

It is common practice among industrial circuit breaker manufacturers to market breakers of different current ratings in a common frame size. Thus, the only significant difference in these circuit breakers is the current settings of their trip units. In the case of industrial circuit breakers utilizing electronic, i.e., static, trip units, this situation has typically been accommodated by selecting phase current sensing transformers tailored to the different current ratings, rather than adjusting or modifying the electronics portion of the trip unit. To afford manufacturing economies, phase current transformers are provided with plural secondary winding taps to which the trip unit electronics is selectively connected depending on the specified current rating of the breaker. Heretofore, these electrical connections between the current transformer secondary winding taps and the trip unit have been effected at the factory in hard wired fashion.

Recently, customers have begun demanding molded case industrial circuit breakers in dual current ratings which can be converted in the field from one rating to the other. Heretofore, this conversion necessitated opening the breaker case and changing the static trip unit wiring terminations from one set of phase current transformer second winding taps to the other set of taps.

It is accordingly an object of the present invention to provide an electrical connector conveniently operable for selectively connecting either one of two sets of incoming leads to a common set of outgoing leads and vice versa.

An additional object is to provide an electrical connector of the above character having particular application to selectively connecting either of two sets of phase current transformer secondary winding taps to the static trip unit of an industrial circuit breaker.

A further object is to provide an electrical connector of the above character which can be readily operated in the field in a safe, reliable manner.

Yet another object is to provide an electrical connector of the above character which is simple in construction, compact in size, inexpensive to manufacture and convenient to implement and use.

Other objects of the invention will in part be obvious and in part appear hereinafter.

SUMMARY OF THE INVENTION

In accordance with the present invention, there is provided an electrical connector operable to selectively connect either of two sets of incoming leads to a common set of outgoing leads. The connector includes a receptacle structured to define a pocket accommodating insertion of a printed circuit card in either of two orientations. A first set of resilient contacts is situated in the receptacle to one side of the pocket with its contacts individually connected to the outgoing leads. Second and third sets of resilient contacts, situated to the other side of the pocket, have their contacts individually electrically connected respectively to the leads of the two incoming sets. Plural pairs of electrically interconnected contact strips are printed on opposite sides of the card in positions to connect the first set of contacts individually to either the contacts of the second set or the contacts of the third set depending upon the orientation of the card as inserted into the pocket.

In the disclosed application of the electrical connector of the present invention, the second set of contacts are connected via one set of incoming leads individually to one set of secondary windings taps of plural phase current sensing transformers utilized in a static trip industrial circuit breaker. The third set of contacts are connected via the other set of incoming leads individually to another set of secondary winding taps which typically constitute terminations of corresponding one ends of the secondary windings. The first set of contacts are then connected via the outgoing leads individually to the circuit breaker static (electronic) trip unit. The corresponding other ends of the secondary windings are individually connected to the static trip unit via a set of common leads. When the card is inserted in one orientation, the contacts of the second set are individually connected via a first plurality of electrically interconnected contact strip pairs to the contacts of the first set, thereby connecting the secondary winding taps to the trip unit. The current rating of the circuit breaker is thus established at the lower value of its dual current rating. Upon insertion of the card in a reversed orientation, the third set of contacts are connected with the first set of contacts via a different plurality of interconnected contact strip pairs to connect the full secondary windings into the trip unit and thus establish the higher current rating of the breaker dual rating.

In accordance with an important feature of the present invention, the contacts of the first set are situated in individually opposed relation with the contacts of the second set and are biased into electrical contacting engagement with each other in the absence of the card. Thus, while the card is removed, the circuit breaker is automatically derated to the lower of its dual current rating. Moreover, removal of the card does not leave the secondary windings open-circuited. This is a significant safety measure to obviate the possibility of dangerously high open-circuit voltages being induced in the phase current transformer secondary windings.

As an additional feature of the invention, the card carries a display panel bearing dual indicia separately viewable through a window in the breaker case to signify that the card has indeed been inserted and in which orientation, thus identifying which of the two possible breaker current ratings has been established.

The invention accordingly comprises the features of construction and arrangement of parts which will be exemplified in the construction hereinafter set forth, and the scope of the invention will be indicated in the claims.

For a better understanding of the nature and objects of the invention, reference should be had to the following detailed description taken in conjunction with the accompanying drawings, in which:

FIG. 2 is an end view of the electrical connector of FIG. 1;

FIG. 4 is a fragmentary plan view of one side of a printed circuit card utilized in the electrical connector of FIG. 1;

FIG. 5 is a fragmentary plan view of the other or reverse side of the printed circuit card utilized in the electrical connector of FIG. 1;

Figure 1:
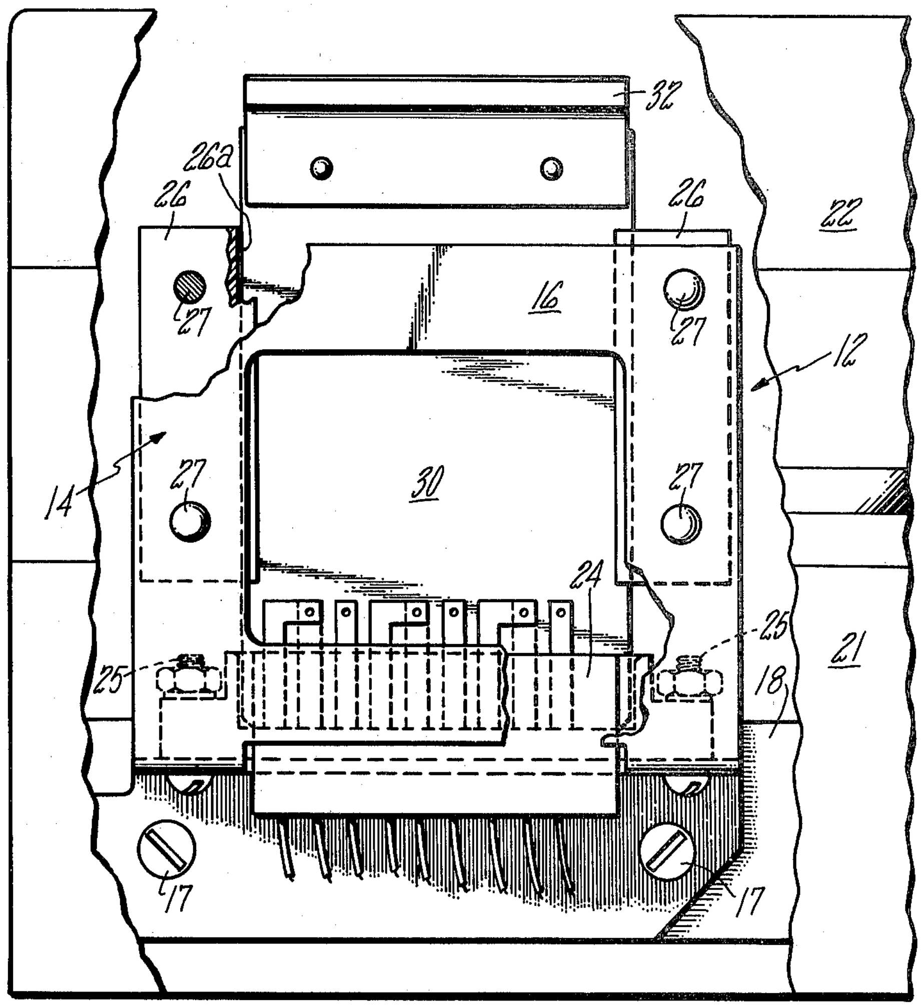
FIG. 1 is a side elevational view of an electrical connector constructed in accordance with the present invention and illustrated in its application to a static trip industrial circuit breaker.
Figure 6:
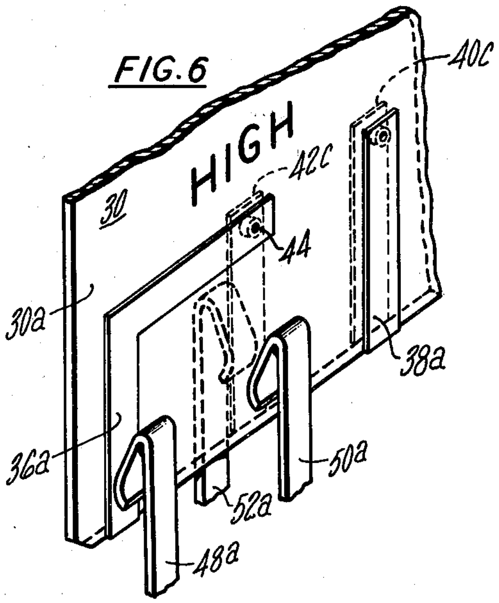
FIG. 6 is a fragmentary perspective view depicting one of the two possible operating conditions of the electrical connector of FIG. 1.
Figure 7:
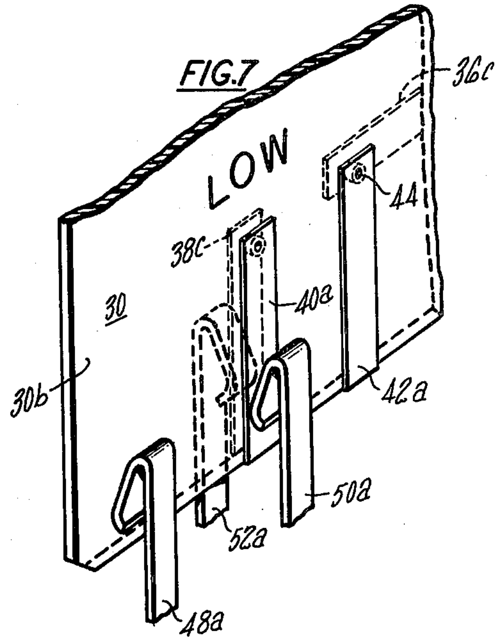
FIG. 7 is a fragmentary perspective view depicting the other possible operating condition of the electrical connector of FIG. 1.
Figure 9:
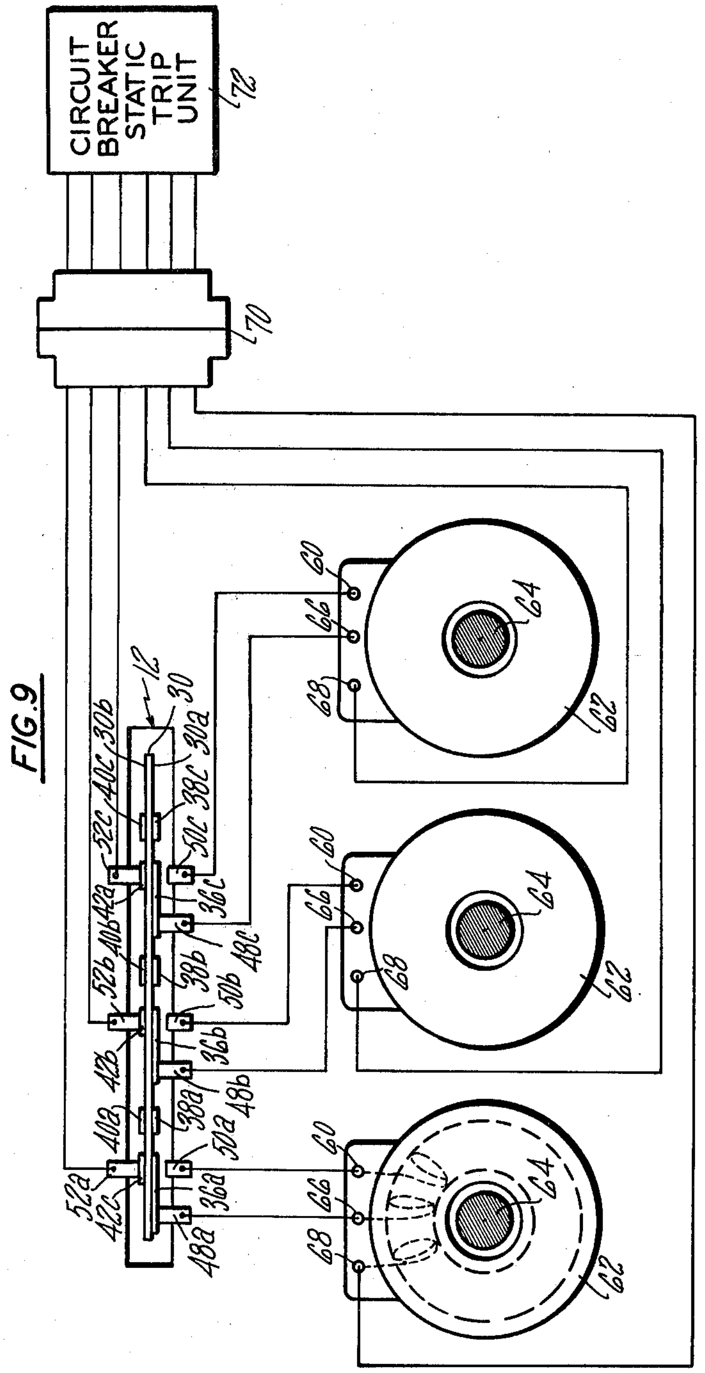
Figure 10:
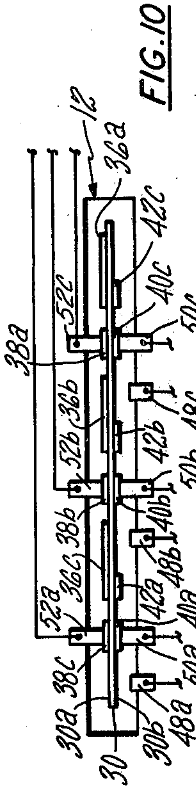

FIG. 9 is a circuit schematic diagram illustrating the electrical connector of FIG. 1 in its operating conditon of FIG. 6 pursuant to connecting corresponding secondary winding terminations of plural phase current transformers through to a circuit breaker static trip unit; and FIG. 10 is a fragmentary circuit diagram illustrating the electrical connector of FIG. 1 in its other operating condition of FIG. 7 pursuant to connecting corresponding secondary winding taps through to the static trip unit of FIG. 9.

Corresponding reference numerals refer to like parts throughout the several views of the drawings.

DETAILED DESCRIPTION

Turning to the drawings, the electrical connector of the present invention, generally indicated at 12 in FIGS. 1 and 2, includes a receptacle, generally indicated at 14. This receptacle comprises an upright bracket 16 which is secured by screws 17 to a stationary member 18 included as part of an industrial static trip circuit breaker, generally indicated at 20 and having a molded case consisting of a base 21 and a removable cover 22. Bracket 16 mounts an insulative transverse receptacle base 24 via bolts 25 and a pair of horizontally spaced, vertically elongated guide blocks 26 via rivets 27. Opposing surfaces of these guide blocks are provided with aligned vertical grooves, as indicated at 26*a* in FIG. 1, serving in conjunction with receptacle base 24 to define a pocket accommodating the insertion of a printed circuit card 30. A display panel 32, secured across the upper edge of card 30, bears the indicia HIGH and LOW (FIG. 3) separately viewable depending on the orientation of the card in holder 14, through a window 34*a* in a plate 34 secured over an opening 22*a* in the breaker cover 22.

Card 30 of rigid, insulative printed circuit board stock has printed adjacent its bottom edge on the side 30*a* seen in FIG. 4 three uniformly spaced, inverted L-shaped, electrically conductive strips 36*a*, 36*b*, 36*c* of one set alternating with three uniformly spaced, straight-sided, electrically conductive strips 38*a*, 38*b*, 38*c* of another set. It will be noted that the former strips are positioned as a set in non-symmetrical relation with the lateral edges of the card, i.e., closer to the left edge as seen in FIG. 4, while the latter strips are positioned as a set closer to the right edge. Adjacent the bottom edge on the reverse side 30*b* of the card, as seen in FIG. 5, there are printed three uniformly spaced, straight-sided, electrically conductive strips 40*a*, 40*b*, 40*c* of a set alternating with three uniformly spaced, straight-sided, electrically conductive strips 42*a*, 42*b*, 42*c* of another set. The former set is positioned closer to the left edge of the card and the latter set is positioned closer to the right edge. The non-symmetrical lateral positionings of these four strip sets serve to locate the individual strips in different transverse positions in receptacle 12 depending upon the orientation of the card relative to the receptacle when inserted therein.

Turning to FIG. 6, it is seen that the upper laterally extending portion of inverted L-shaped strip 36*a* printed on side 30*a* of the card extends across into opposed relation with strip 42*c* printed on the other side 30*b* and is electrically connected thereto by the provision of a so-called "through plated hole" 44. As seen in FIG. 7, the portion of inverted L-shaped strip 36*c* opposing strip 44*a* electrically connected thereto via through plated hole connection 44. While not shown in FIGS. 6 and 7, it will be understood that inverted L-shaped strip 36*b* and strip 42*b* are interconnected or electrically paired in like fashion. As also seen in FIG. 6, strips 38*a* and 40*c*, positioned in opposing relation, are electrically interconnected at 44, and, as seen in FIG. 7, the same is true of opposing strips 38*c* and 40*a*. Opposed strips 38*b* and 40*b* are likewise electrically interconnected.

As partially, structurally illustrated in FIGS. 6 and 7, and fully diagrammatically illustrated in FIGS. 9 and 10, the receptacle base mounts a set of three uniformly spaced, resilient contacts 48*a*, 48*b*, 48*c* individually alternating with uniformly spaced, resilient contacts 50*a*, 50*b*, 50*c* of another set. These first and second contact sets are positioned to one side of the card pocket with the individual contacts biased to effect electrically contacting engagement with any strips registered therewith upon full insertion of card 30. To the other side of the card pocket, receptacle base 24 mounts still another set of resilient contacts 52*a*, 52*b*, 52*c*, positioned in individual opposing relation with contacts 50*a*, 50*b*, 50*c* and biased to effect electrically contacting engagement with the strips on the inserted card registered therewith. In the case of contacts 52*a*, 52*b* and 52*c*, electrical engagement with card strips is achieved regardless of the orientation of the inserted card, as seen in FIGS. 9 and 10. In contrast, only one or the other of the sets of contacts 48*a*, 48*b*, 48*c* and 50*a*, 50*b*, 50*c* are registered with card strips, depending on the orientation of the inserted card. The contacts of the set not registered with card strips are simply terminated in insulative fashion against the non-conductive surface of the card. This is illustrated in FIG. 6 in the case of contact 50*a* and in FIG. 7 in the case of contact 48*a*. In FIGS. 9 and 10, these insulative terminations are illustrated diagrammatically by showing those contacts in spaced relation to the card surfaces.

From the description thus far, it is seen that when card 30 is inserted in the orientation seen in FIGS. 6 and 9, i.e., with card side 30*a* confronting the sets of contacts 48*a*, 48*b*, 48*c* and 50*a*, 50*b*, 50*c*, the former set of contacts are individually electrically connected to contacts 52*a*, 52*b*, 52*c* via the electrically interconnected strip pairs 36*a*–42*c*, 36*b*–42*b*, and 36*c*–42*c*, respectively. On the other hand, when the card is reversed, lateral edge for lateral edge, and the inserted, card side 30*b* confronts the sets of contacts 48*a*, 48*b*, 48*c* and 50*a*, 50*b*, 50*c*, as seen in FIGS. 7 and 10. In this case, the latter set of contacts are individually electrically connected to contacts 52*a*, 52*b*, 52*c* via the electrically interconnected strip pairs 38*c*–40*a*, 38*b*–40*b* and 38*a*–40*c*, respectively.

In the application of the electrical connector 12 to an industrial, static trip circuit breaker having a dual current rating capability, contacts 50*a*, 50*b*, 50*c* are respectively wired to corresponding secondary winding taps 60 of separate current transformers 62 individually inductively coupled with the three phase conductors 64 of the protected circuit. Contacts 48*a*, 48*b*, 48*c* are then respectively wired to corresponding other secondary winding taps 66 of the three current transformers 62; these taps typically being terminations of corresponding one sides of the secondary windings. The corresponding other sides of the secondary windings, terminated at taps 68, are brought out via separate leads to the male half of a plug connector 70, which, when mated with its female half, separately applies these secondary winding terminations to a circuit breaker static trip unit 72. Contacts 52*a*, 52*b*, 52*c* of connector 12 are brought out via separate leads to the plug connector for application as separate inputs to the static trip unit.

Figure 3:
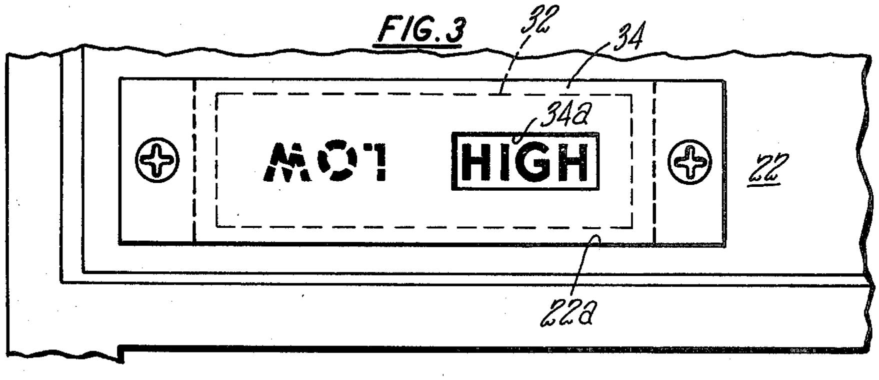
FIG. 3 is a top view of the electrical connector of FIG. 1.

It is seen that with card 30 inserted in the receptacle pocket in orientation seen in FIGS. 6 and 9, the full secondary windings of the three current transformers 62 are separately connected via connector 12 into static trip unit 72 to establish the higher of the two current ratings to which the circuit breaker can be set. In this card orientation, the indicia HIGH on display panel 32 is registered with window 34*a* in the breaker cover 22 (FIG. 3). Reversal of card 30 to its orientation seen in FIGS. 7 and 10 conditions connector 12 to separately connect the tapped portions of the three transformer secondary windings into the static trip unit. The lower of the two possible current ratings is established, and the display panel indicia LOW is registered with cover window 34*a*.

Figure 8:
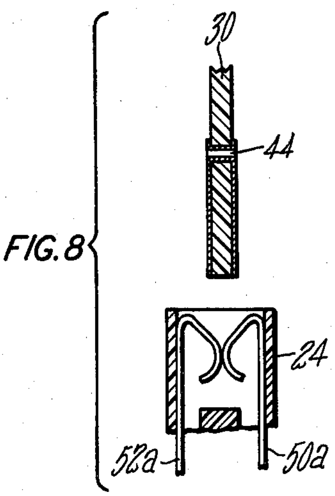
FIG. 8 is a fragmentary end view of the electrical connector of FIG. 1 depicting the interengaging condition of certain of the connector contacts assumed in the absence of the printed circuit card.

As previously noted, connector contacts 50*a*, 50*b*, 50*c* are situated in base 24 in respectively opposed relation with contacts 52*a*, 52*b*, 52*c*. These contacts are sprung such that, in the absence of card 30, the opposed pairs are in mutual electrically contacting engagement, as seen in FIG. 8 in the case of contacts 50*a* and 52*a*. From FIG. 9 it is seen that interengagement of these opposed contact pairs incidentally connects the tapped portions of the transformer secondary windings into the trip unit 72, thus establishing the lower current rating in the absence of card 30. This is a desirable safety measure from the standpoint of circuit protection. Moreover, by virtue of this construction, removal of the card does not open circuit the transformer secondary windings, thus precluding the development of high open-circuit voltages therein which are potentially hazardous to personnel and damaging to the secondary winding insulation.

While in the disclosed embodiment, the contact strips are printed along one edge of the card 30, it will be appreciated that, they may be positioned in spaced relation to the card edge. Moreover, additional sets of opposed, electrically interconnected strips may be arrayed elsewhere on the card to accommodate more than two different card orientations in selectively interconnecting any one of more than two sets of incoming leads to a common set of outgoing leads or any one of plural sets of incoming leads to any one of plural sets of outgoing leads.

It will thus be seen that the objects set forth above, among those made apparent in the preceding description, are efficiently attained and, since certain changes may be made in the above construction without departing from the scope of the invention, it is intended that all matter contained in the above description or shown in the accompanying drawings shall be interpreted as illustrative and not in a limiting sense.

Having described our invention, what we claim as new and desire to secure by Letters Patent is:

1. A selectable tap changing electrical connector for separately electrically connecting either corresponding first or second secondary winding taps of each of a plurality of phase current transformers to the static trip unit of an industrial circuit breaker, said connector comprising, in combination:

A. a card having opposed first and second insulative surfaces;

B. a receptacle having a pocket accommodating insertion of said card;

C. a first set of contacts situated to one side of said pocket for individual electrical connection to the circuit breaker static trip unit;

D. a second set of contacts situated to the other side of said pocket and individually electrically connected respectively to corresponding first secondary winding taps of the phase current transformers;

E. a third set of contacts situated to said other side of said pocket and individually electrically connected respectively to corresponding second secondary winding taps of the phase current transformers; and F. plural sets of discrete conductive strips positioned on said first and second insulative card surfaces, certain strips on said first surface individually electrically connected with certain strips on said second surface such that, upon insertion in said pocket of said card in one orientation, said first and second sets of contacts individually engage electrically interconnected pairs of said strips, and, upon insertion in said pocket of said card in a reversed orientation, said first and third sets of contacts individually engage different electrically interconnected pairs of said strips.

2. The electrical connector defined in claim 1, wherein said contacts of said third set are insulatively terminated against one of said first and second card surfaces upon insertion in said pocket of said card in said one orientation, and said contacts of said second set are insulatively terminated against the other of said first and second card surfaces upon insertion in said pocket of said card in said reversed orientation.

3. The electrical connector defined in claim 1, wherein the circuit breaker has a molded case, and said connector further includes a display panel mounted by said card, said panel bearing plural indicia separately viewable through a window in the breaker case depending upon the orientation of said card as inserted in said pocket.

4. The electrical connector defined in claim 1, wherein said contacts of said first set are situated in individually opposed relation with said contacts of said second set, said contacts being individually sprung such that the respectively opposed contacts of said first and second sets interengage upon removal of said card from said pocket.

5. The electrical connector defined in claim 4, wherein the circuit breaker has a molded case, and said connector further includes a display panel mounted by said card, said panel bearing plural indicia separately viewable through a window in the breaker case depending upon the orientation of said card as inserted in said pocket.

6. The electrical connector defined in claim 2, said card is converted between said one orientation and said reversed orientation by exchanging the positions of its lateral edges prior to insertion in said pocket, and wherein said plural sets of conductive strips comprise:

(1) a first set of equally spaced strips printed on said first insulative card surface in non-symmetrical relation with the lateral edges of said card, (2) a second set of strips printed on said second insulative card surface in individual opposed relation with said strips of said first set, the respectively opposed contacts of said first and second sets being permanently electrically interconnected through said card, (3) a third set of equally spaced strips printed on said first insulative surface in non-symmetrical relation with the lateral edges of said card, said strips of said third set arranged in alternating fashion with said strips of said first set, and (4) a fourth set of equally spaced strips printed on said second insulative surface in individually non-opposed relation with said strips of said first and third sets, said strips of said fourth set each including lateral conductive portions extending into opposed relation with respective contact strips of said third set for permanent electrical interconnection therewith through said card.

7. The electrical connector defined in claim 6, wherein the circuit breaker has a molded case, and said connector further includes a display panel mounted by said card, said panel bearing plural indicia separately viewable through a window in the breaker case depending upon the orientation of said card as inserted in said pocket.

8. The electrical connector defined in claim 6, wherein said contacts of said first set are situated in individually opposed relation with said contacts of said second set, said contacts being individually sprung such that the respectively opposed contacts of said first and second set interengage upon removal of said card from said pocket.

9. The electrical connector defined in claim 8, wherein the circuit breaker has a molded case, and said connector further includes a display panel mounted by said card, said panel bearing plural indicia separately viewable through a window in the breaker case depending upon the orientation of said card as inserted in said pocket.

10. An electrical connector comprising, in combination:

A. a printed circuit card having opposed first and second insulative surfaces;

B. a first set of equally spaced contact strips printed on said first insulative surface in non-symmetrical relation with the lateral edges of said card;

C. a second set of contact strips printed on said second insulative surface in individual opposed relation with said contact strips of said first set, the respectively opposed contacts of said first and second sets being permanently electrically interconnected through said card;

D. a third set of equally spaced contact strips printed on said first insulative surface in non-symmetrical relation with the lateral edges of said card, said contact strips of said third set arranged in alternating fashion with said contact strips of said first set;

E. A fourth set of equally spaced contact strips printed on said second insulative surface in individually non-opposed relation with said contact strips of said first and third sets, said contact strips of said fourth set each including lateral conductive portions extending into opposed relation with respective contact strips of said third set for permanent electrical interconnection therewith through said card;

F. a receptacle defining a pocket accommodating insertion of said card, said receptacle including lateral edge guide means for laterally locating said card upon its insertion in said pocket;

G. a first set of equally spaced contacts situated in said receptacle to one side of said pocket, said contacts individually engaging respective contact strips of said second set upon insertion in said pocket of said card in one lateral edge to edge orientation and individually engaging respective contact strips of said third set upon insertion in said pocket of said card in a reversed lateral edge to edge orientation;

H. a second set of equally spaced contacts situated in said receptacle to the other side of said pocket, said contacts individually engaging respective contact strips of said first set upon insertion in said pocket of said card in said one orientation to be individually electrically connected with respective contacts of said first set and engaging said second insulative surface upon insertion in said pocket of said card in said reversed orientation; and I. a third set of equally spaced contacts situated in said receptacle to said other side of said pocket, said contacts individually engaging respective contact strips of said fourth set upon insertion in said pocket of said card in said reversed orientation to be individually electrically connected with respective contacts of said first set and engaging said first insulative surface upon insertion in said pocket of said card in said one orientation.

* * * * *